United States Patent
Takai et al.

(10) Patent No.: US 6,819,433 B2
(45) Date of Patent: Nov. 16, 2004

(54) EXPOSURE APPARATUS INCLUDING INTERFEROMETER SYSTEM

(75) Inventors: Ryo Takai, Tochigi (JP); Kazunori Iwamoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 106 days.

(21) Appl. No.: 10/073,593

(22) Filed: Feb. 12, 2002

(65) Prior Publication Data
US 2002/0109850 A1 Aug. 15, 2002

(30) Foreign Application Priority Data

Feb. 15, 2001 (JP) .............................. 2001-038230
Feb. 5, 2002 (JP) .............................. 2002-028332

(51) Int. Cl.[7] ............................................. G01B 9/02
(52) U.S. Cl. .................................................. 356/500
(58) Field of Search ....................... 356/496, 498, 356/500

(56) References Cited

U.S. PATENT DOCUMENTS

| | | | |
|---|---|---|---|
| 5,781,277 A | 7/1998 | Iwamoto | 355/53 |
| 6,020,964 A | * 2/2000 | Loopstra et al. | 356/500 |
| 6,069,683 A | 5/2000 | Iwamoto | 355/53 |
| 6,160,628 A | 12/2000 | Inoue | 356/500 |
| 6,285,457 B2 | * 9/2001 | Ukaji | 356/500 |

FOREIGN PATENT DOCUMENTS

| | | |
|---|---|---|
| JP | 4-179115 | 6/1992 |
| JP | 8-241849 | 9/1996 |
| JP | 2000-049066 | 2/2000 |
| KR | 2000-0070669 | 11/2000 |
| WO | WO 99/28790 | 6/1999 |

OTHER PUBLICATIONS

Chinese Office Action dated Apr. 2, 2004, issued in a corresponding Chinese patent application, No. 02105045.7.

Korean Office Action dated Jan. 14, 2004, issued in a corresponding Korean patent application, No. 10-2002-0008059.

* cited by examiner

Primary Examiner—Samuel A. Turner
Assistant Examiner—Michael A. Lyons
(74) Attorney, Agent, or Firm—Fitzpatrick, Cella, Harper & Scinto

(57) ABSTRACT

To accurately measure the position and posture of a stage apparatus used in an exposure apparatus or the like, the Z position and displacement of a top stage (27) are measured using as a reference a lens barrel support (35) independently of the top stage in terms of vibrations by an interferometer system which includes a projection optical system (34) for projecting a pattern formed on a master onto a substrate, stages (27, 31, 40) capable of moving with respect to the projection optical system (34) while holding the substrate or master, and a lens barrel support (35) that supports the projection optical system (34), and which uses a Z measuring mirror (30) that is arranged on a Y stage (31) and has a reflecting surface almost parallel to the XY plane, and a Z interferometer (25) arranged on the Y stage (31).

37 Claims, 15 Drawing Sheets

FIG. 10

```
URL  http://www.maintain.co.jp/db/input.html
TROUBLE DB INPUT EINDOW

OCCURRENCE DATE    2000/3/15  ~404
TYPE OF APPARATUS  **********  ~401
OBJECT  OPERATION ERROR (START-UP ERROR)  ~403
DEVICE S/N  465NS4580001  ~402
DEGREE OF URGENCY  D  ~405
SYMPTOM   LED KEEPS FLICKERING
          AFTER POWER ON            ~406

REMEDY    POWER ON AGAIN
          (PRESS RED BUTTON IN ACTIVATION)  ~407

PROGRESS  INTERIM HAS BEEN DONE.    ~408

[SEND] [RESET]   410                  411              412
         LINK TO RESULT LIST DATABASE   SOFTWARE LIBRARY   OPERATION GUIDE
```

SEMICONDUCTOR DEVICE MANUFACTURING FLOW

EXPOSURE APPARATUS INCLUDING INTERFEROMETER SYSTEM

FIELD OF THE INVENTION

The present invention relates to an exposure apparatus which includes an interferometer system which measures the position and displacement of an object in the vertical direction and is used to manufacture a liquid crystal board or semiconductor device.

BACKGROUND OF THE INVENTION

FIGS. 13 and 14 show an example of a measuring means for an alignment apparatus used in a conventional semiconductor exposure apparatus or the like. FIG. 13 is a perspective view showing the arrangement of a measuring system using a laser interferometer. FIG. 14 is a front view showing the overall conventional semiconductor exposure apparatus having the measuring system.

In FIG. 14, reference numeral 7 denotes an illumination unit for illuminating a reticle pattern; 8, a reticle having a pattern to be transferred; 9, a projection lens for projecting a reticle pattern onto a wafer; 10, a lens barrel support which supports the projection lens 9; 11, a stage surface plate; 13, an X stage; 14, a Y stage; 15, an X stage driving guide/X linear motor; and 16, a Y stage driving guide/Y linear motor. A top stage 2 for precise alignment is mounted on the X and Y stages. The top stage 2 moves a long stroke in the X- and Y-axis directions by the guides 15 and 16 and an actuator. Further, the top stage 2 moves a short stroke in the Z-axis direction and rotational directions ωX, ωY, and θ by a Z actuator 17 which drives the top stage 2 with respect to the X stage 13.

In FIG. 13, reference numeral 1 denotes a wafer chuck which supports a wafer (not shown). The top stage 2 constitutes a stage which supports the wafer chuck 1. Reference numeral 3 denotes an X mirror which is attached to the top stage 2 and has a reflecting surface perpendicular to the X-axis; 4, a Y mirror which is attached to the top stage 2 and has a reflecting surface perpendicular to the Y-axis; 5a, 5b, and 5c, X interferometers for measuring an X position; and 6a and 6b, Y interferometers for measuring a Y position. The X interferometers 5a, 5b, and 5c, and Y interferometers 6a and 6b are fixedly supported by a lens barrel support 10 shown in FIG. 14.

In alignment by an apparatus conventionally called an alignment apparatus, a laser beam is sent to strike each predetermined position on a reflecting mirror attached to a stage. Position variation information at the beam incident position along the beam incident direction is acquired from the reflected beam to perform position detection. Alignment control is done based on the detection result. As a rotational direction detection means, pieces of position variation information at two beam incident positions along a single axis are obtained. More specifically, the measuring system in FIG. 13 detects positions in the X, θ, and ωY directions from pieces of position variation information based on the X interferometers 5a, 5b, and 5c and in the Y and ωX directions by the Y interferometers 6a and 6b. Alignment control along the five axes except for the Z-axis is performed based on pieces of position detection information by the laser interferometers.

Referring back to FIG. 14, reference numerals 12 denote Z displacement sensors such as linear encoders or electrostatic capacitance sensors arranged in the above-described stage. The Z displacement sensors 12 measure displacement of the top stage 2 with respect to the X stage 13 at three positions, and can measure displacements of the top stage 2 in the Z and tilt directions. The Z tilt direction of the top stage 2 with respect to the lens barrel support 10 can be measured from the measurement values of the Z displacement sensors 12 and those of three interferometers (not shown) for performing Z measurement of the stage surface plate 11 with respect to the lens barrel support 10. Z-axis alignment control is executed based on the detection results.

Alternatively, Z measurement of the top stage 2 may be directly performed using an interferometer, as shown in FIG. 15. In FIG. 15, reference numeral 18 denotes a mirror attached to the lens barrel support 10 in order to perform Z measurement; 19, a mirror which is integrally made up of an X mirror and a Z measuring mirror which forms an acute angle with the X mirror, and reflects, to the Z direction, measurement light incident parallel to the plane in which the top stage 2 moves; and 20, a Z measuring interferometer 20. This measuring method can directly measure the Z position and displacement of the top stage 2 by using the lens barrel support 10 as a measurement reference.

The alignment apparatus using the above Z position detection means suffers from the following problems.

In the prior art shown in FIGS. 13 and 14, Z position information of the top stage is obtained from the positional relationship between the X stage and the top stage. A measurement error occurs due to deformation of the stage guide when the stage accelerating/decelerating inertial force or stage weight acts as a moving load, or by deformation of the surface stage or structure which supports the stage. This inhibits precise alignment.

In the prior art shown in FIG. 15, the X or Y measuring mirror and the Z measuring mirror having an inclined surface are integrated. The X or Y measuring mirror which must exhibit high precision undergoes processing or mirror adhesion for Z measurement. This decreases the flatness and alignment precision. The alignment precision also decreases owing to an increase in weight or deformation caused by changes in adhesive over time.

SUMMARY OF THE INVENTION

The present invention has been proposed to solve the conventional problems, and has as its object to provide an exposure apparatus including an interferometer system that enable Z-direction measurement using a lens barrel support as a measurement reference and enable high-precision alignment by only mounting a bar mirror on a stage.

To solve the above problems, an exposure apparatus according to the present invention, having a projection optical system for projecting a pattern formed on a master onto a substrate, a stage capable of moving with respect to the projection optical system while holding at least one of the substrate and master, and a lens barrel support which supports the projection optical system, includes: an interferometer system having an interferometer for measuring a Z position and displacement of the stage with respect to the lens barrel support by using a Z measuring mirror which is arranged on the stage and has a reflecting surface substantially parallel to an XY plane.

More specifically, the exposure apparatus comprises a projection optical system for projecting a pattern formed on a master onto a substrate, a stage capable of moving with respect to the projection optical system while holding the substrate or master, and a lens barrel support which supports the projection optical system, and includes an interferometer system having an interferometer for measuring the position or displacement of the stage with respect to the lens barrel support. In this arrangement, the interferometer is arranged on at least one of the X and Y movable portions of the stage. Measurement light emitted by the interferometer is guided almost perpendicularly to the XY plane. The measurement light is reflected by a first reflecting surface attached to the lens barrel support toward the center of the lens barrel support, and travels toward a second reflecting surface at the center.

The measurement light is reflected by the second reflecting surface to almost perpendicularly strike a bar mirror having a reflecting surface almost parallel to the moving plane of the stage. Z measurement is performed by the reflected measurement light.

In the exposure apparatus, the interferometer system desirably includes a plurality of interferometer systems arranged on the apparatus. The interferometer may be mounted on either of the stage and a movable portion which follows the stage. The stage may have an elongated mirror for Z measurement which is longer in the stroke direction of the movable portion which supports the interferometer, and the elongated mirror for Z measurement may use the upper surface of either of the X and Y measuring mirrors. In the interferometer system, measurement light emitted by the interferometer may strike the Z measuring mirror via a plurality of mirrors or prisms attached to the lens barrel support serving as a measurement reference. Measurement light incident on the Z measuring mirror is preferably almost perpendicular to the reflecting surface.

The interferometer desirably emits a total of four beams including two measurement beams and two, reference beams, and the four beams are desirably formed with a cross-shaped positional relationship at an almost equal interval. A mirror or prism arranged immediately in front of the Z measuring mirror desirably has at least two reflecting surfaces for reflecting measurement light to the Z measuring mirror and reference light back to the incident optical path.

An exposure apparatus according to the present invention comprises a Y stage movable in a Y direction; an X stage movable in an X direction with respect to the Y stage; a Z mirror which is mounted on the X stage or Y stage and has a reflecting surface parallel to an XY plane, a mirror or prism for guiding to the Z mirror a beam emitted in a Z direction by the Y stage; and an interferometer for detecting a Z position of the X stage or Y stage by using the beam reflected by the Z mirror.

In this case, the interferometer is desirably mounted on the Y stage or X stage. The interferometer is desirably mounted in the X or Y direction, the exposure apparatus desirably further comprises an optical element having a reflecting surface for reflecting a beam from the X or Y direction to the Z direction, and the interferometer desirably emits a beam parallel to the X or Y direction toward the optical element. The mirror or prism for guiding the beam to the Z mirror may have a first mirror or prism for reflecting to the X or Y direction a beam emitted to the Z direction by the Y stage or X stage, and a second mirror or prism for reflecting to the Z direction the beam reflected by the first mirror or prism and irradiating the Z mirror with the beam. The first mirror or prism and the second mirror or prism are desirably elongated in the X or Y direction. The second mirror or prism preferably has a reflecting surface for reflecting to the first mirror or prism a reference light component of the beam reflected by the first mirror or prism.

A semiconductor device manufacturing method according to the present invention comprises the steps of installing a plurality of semiconductor manufacturing apparatuses including any one of the above-described exposure apparatuses, in a semiconductor manufacturing factory, and manufacturing a semiconductor device by using the plurality of semiconductor manufacturing apparatuses.

Preferably, the semiconductor device manufacturing method further comprises the steps of connecting the plurality of semiconductor manufacturing apparatuses to a local area network; connecting the local area network to an external network outside the semiconductor manufacturing factory; acquiring information about the exposure apparatus from a database on the external network by using the local area network and the external network; and controlling the exposure apparatus on the basis of the acquired information.

Preferably, in the semiconductor device manufacturing method, a database provided by a vendor or user of the exposure apparatus is accessed via the external network, thereby obtaining maintenance information of the manufacturing apparatus by data communication, or data communication is performed between the semiconductor manufacturing factory and another semiconductor manufacturing factory via the external network, thereby performing production management.

A semiconductor manufacturing factory according to the present invention comprises a plurality of semiconductor manufacturing apparatuses including any one of the above-described exposure apparatuses, a local area network for connecting the plurality of semiconductor manufacturing apparatuses, and a gateway for connecting the local area network to an external network outside the semiconductor manufacturing factory, wherein information about at least one of the plurality of semiconductor manufacturing apparatuses can be communicated.

A maintenance method for an exposure apparatus installed in a semiconductor manufacturing factory according to the present invention comprises the steps of preparing a database for accumulating information about maintenance of the exposure apparatus on an external network outside a factory where any one of the above-described exposure apparatuses is installed, connecting the exposure apparatus to a local area network in the factory, and maintaining the exposure apparatus on the basis of information accumulated in the database by using the external network and the local area network.

Preferably, the exposure apparatus according to the present invention further comprises an interface for connecting a network; a computer for executing network software for communicating maintenance information of the exposure apparatus via the network; and a display for displaying the maintenance information of the exposure apparatus that is communicated by the network software executed by the computer.

Preferably, in the exposure apparatus according to the present invention, the network software provides on the display a user interface for accessing a maintenance database which is provided by a vendor or user of the exposure apparatus and connected to the external network outside a factory where the exposure apparatus is installed, and enables obtaining information from the database via the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10 is a view showing an example of a user interface;

DETAILED DESCRIPTION OF THE PREFERRED EMBODIMENTS

Preferred embodiments of the present invention will now be described in detail in accordance with the accompanying drawings.

First Embodiment

Figure 2:
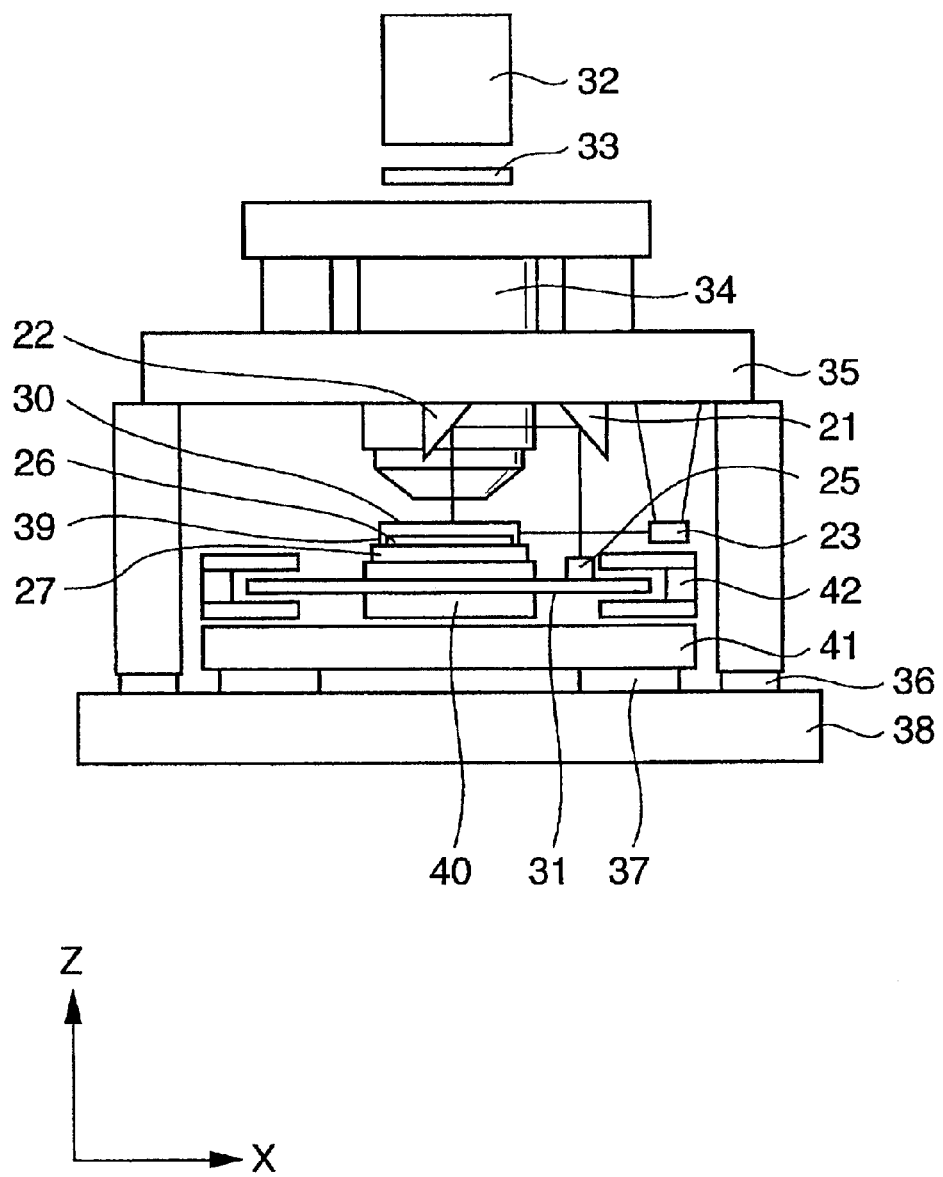
FIG. 2 is a front view showing an exposure apparatus according to the embodiment of the present invention.

FIG. 2 is a schematic front view of a semiconductor exposure apparatus according to the first embodiment that best shows the features of the present invention.

In FIG. 2, reference numeral 32 denotes an illumination unit for illuminating a reticle as a master; 33, a reticle having a pattern to be transferred; 34, a projection lens (projection optical system) for projecting a pattern formed on the reticle 33 onto a wafer serving as a substrate; 35, a lens barrel support which supports the lens 34; 36, a main body (lens barrel support) active mount which supports the lens barrel support 35 to suppress its vibrations and cuts off vibrations from the floor; and 38, an alignment surface plate which aligns the relative positions of the main body active mount 36 and a stage active mount 37 and allows installing their mounts.

Figure 1:
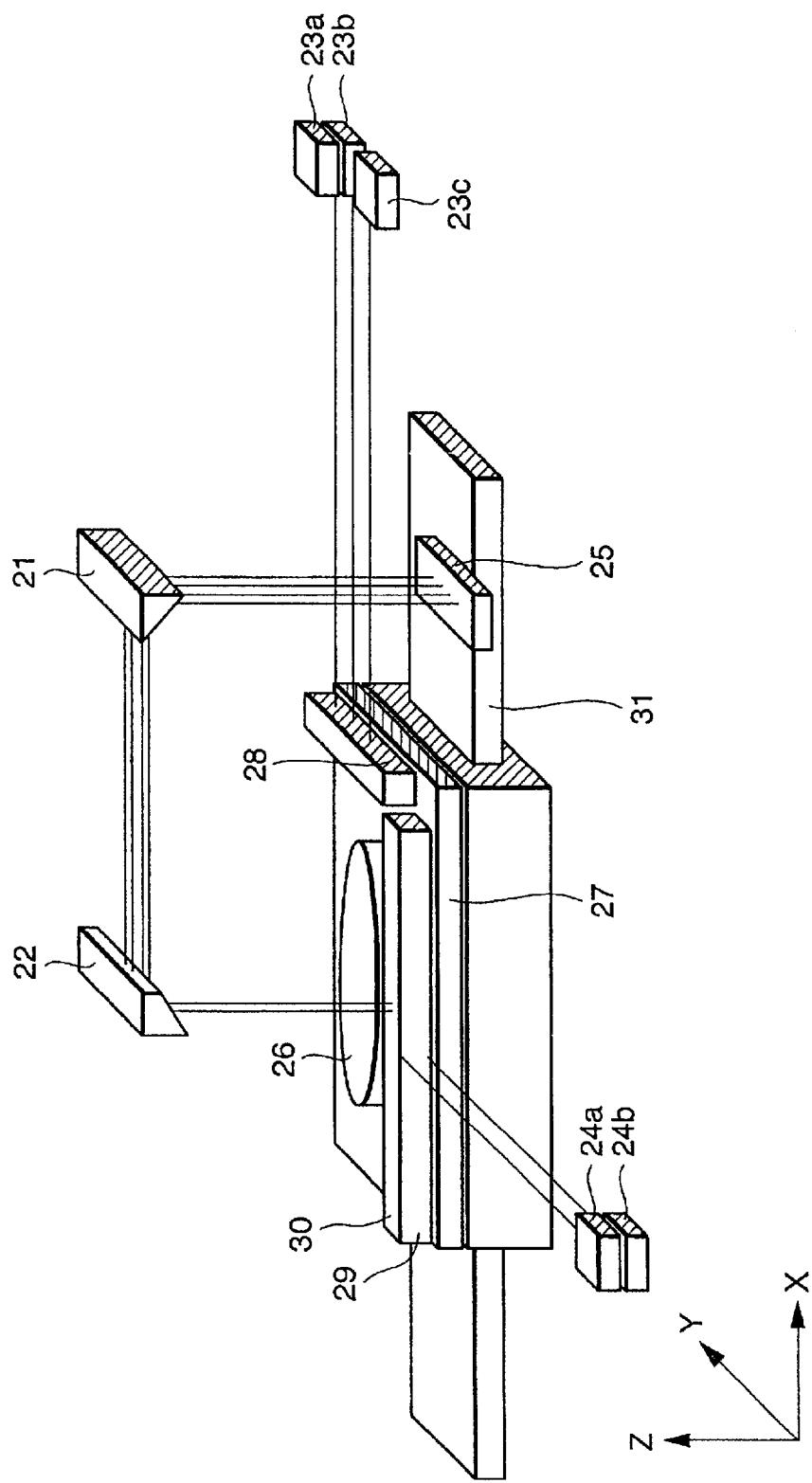
FIG. 1 is a perspective view schematically showing Z measurement according to the first embodiment of the present invention.

Reference numerals 21 and 22 denote Z measuring mirrors fixed to the lens barrel to support 35; and 39, a movable mirror for Z measurement which has two reflecting surfaces and is integrated with a Y mirror 29 (which is shown in FIG. 1 and will be described later).

Reference numeral 31 denotes a Y stage movable in the Y direction; 40, an X stage movable in the X direction with respect to the Y stage 31; and 41, a stage surface plate which supports the X stage 40 and Y stage 31. The stage active mount 37 suppresses vibrations of the stage surface plate 41 caused by movement of the stage, and cuts off vibrations from the floor.

The Y stage 31 and X stage 40 are supported in a non-contact manner by the stage surface plate 41 via a hydrostatic bearing (not shown).

Reference numeral 42 denotes a driving Y linear motor for moving the Y stage 31 in the Y direction. The movable element of the Y linear motor 42 is attached to the Y stage 31, and its stator element is attached onto the stage surface plate 41. The stator element of the Y linear motor may be supported in a non-contact manner by the stage surface plate 41 via a hydrostatic bearing (not shown), or may be fixed to the stage surface plate 41. The exposure apparatus further comprises a driving X linear motor (not shown) for moving the X stage 40 in the X direction. The movable element of the X linear motor is attached to the X stage, and its stator element is attached to the Y stage. The X linear motor generates an X-direction driving force between the Y stage 31 and the X stage 40.

Reference numeral 23 denotes a laser interferometer for measuring the relative position of the lens barrel support 35 and that of a substrate top stage 27, and measuring the posture of the top stage 27; and 25, a Z interferometer for measuring from the Y stage 31 the distance between the lens barrel support 35 and the movable mirror 39 on the top stage 27, and calculating the Z position of the top stage 27. The top stage 27 is mounted on the X stage 40, and can be slightly moved by an actuator (not shown) with respect to the X stage 40.

Reference numeral 26 denotes a wafer chuck (substrate holder) for holding a semiconductor substrate (wafer; not shown) coated with a photosensitive agent that is to be exposed to a pattern. The θZ (top stage) 27 aligns the wafer chuck 26 in the Z, θ, ωX, and ωY directions.

FIG. 1 shows the arrangement of an interferometer system for measuring the position and displacement of the top stage 27 by the laser interferometer 23, a laser interferometer 24, and the laser interferometer 25 for Z measurement.

In FIG. 1, the wafer chuck 26 supports a wafer (not shown). The top stage 27 supports the wafer chuck 26. The top stage 27 moves a long stroke in the X and Y directions by a guide and an actuator (neither is shown), and moves a short stroke in the Z direction and rotational directions ωX, ωY, and θ.

Reference numeral 28 denotes an X mirror attached to the top stage 27. The Y mirror 29 is attached to the top stage 27. Reference numeral 30 denotes a Z mirror integrated on the upper surface of the Y mirror 29. The X mirror 28 is arranged with its reflecting surface perpendicular to the X direction. The Y mirror 29 is arranged with its reflecting surface perpendicular to the Y direction. The Z mirror 30 is an optical member arranged with its reflecting surface parallel to the XY plane.

Reference numerals 23a, 23b, and 23c denote X interferometers for measuring an X position. The X interferometers 23a, 23b, and 23c send laser beams parallel to the X direction to predetermined positions on the reflecting surface of the X mirror 28. From the reflected beams, the X interferometers 23a, 23b, and 23c detect pieces of position variation information along the beam incident direction (X direction). Reference numerals 24a and 24b denote Y interferometers for measuring a Y position. The Y interferometers 24a and 24b send laser beams parallel to the Y direction to predetermined positions on the reflecting surface of the Y mirror 29. From the reflected beams, the Y interferometers 24a and 24b detect pieces of position variation information along the beam incident direction (Y direction).

The interferometers 23 and 24 are fixedly supported by a support (not shown) serving as a measurement reference. For example, the laser interferometers 23 and 24 are fixed to the lens barrel support, which is a structure integrated with the projection lens 34.

The Z interferometer 25 for measuring a Z position is mounted on the Y stage 31. The Z interferometer 25 is arranged to emit a beam by the Z interferometer 25 so as to be perpendicularly incident on the XY plane, or is so constituted as to guide the emitted beam perpendicularly to the XY plane by an optical element such as a mirror.

The first and second mirrors 21 and 22 guide light emitted by the Z interferometer 25 to the Z mirror 30. The first and second mirrors 21 and 22 are supported and fixed so as to have a reflecting surface with an acute angle with respect to the lens barrel support 35 serving as a measurement reference or to measurement light from the Z interferometer 25. The first and second mirrors 21 and 22 are elongated mirrors long in the stroke direction (Y direction) of the movable portion (Y stage 31) on which the Z interferometer 25 is arranged.

Figure 5:
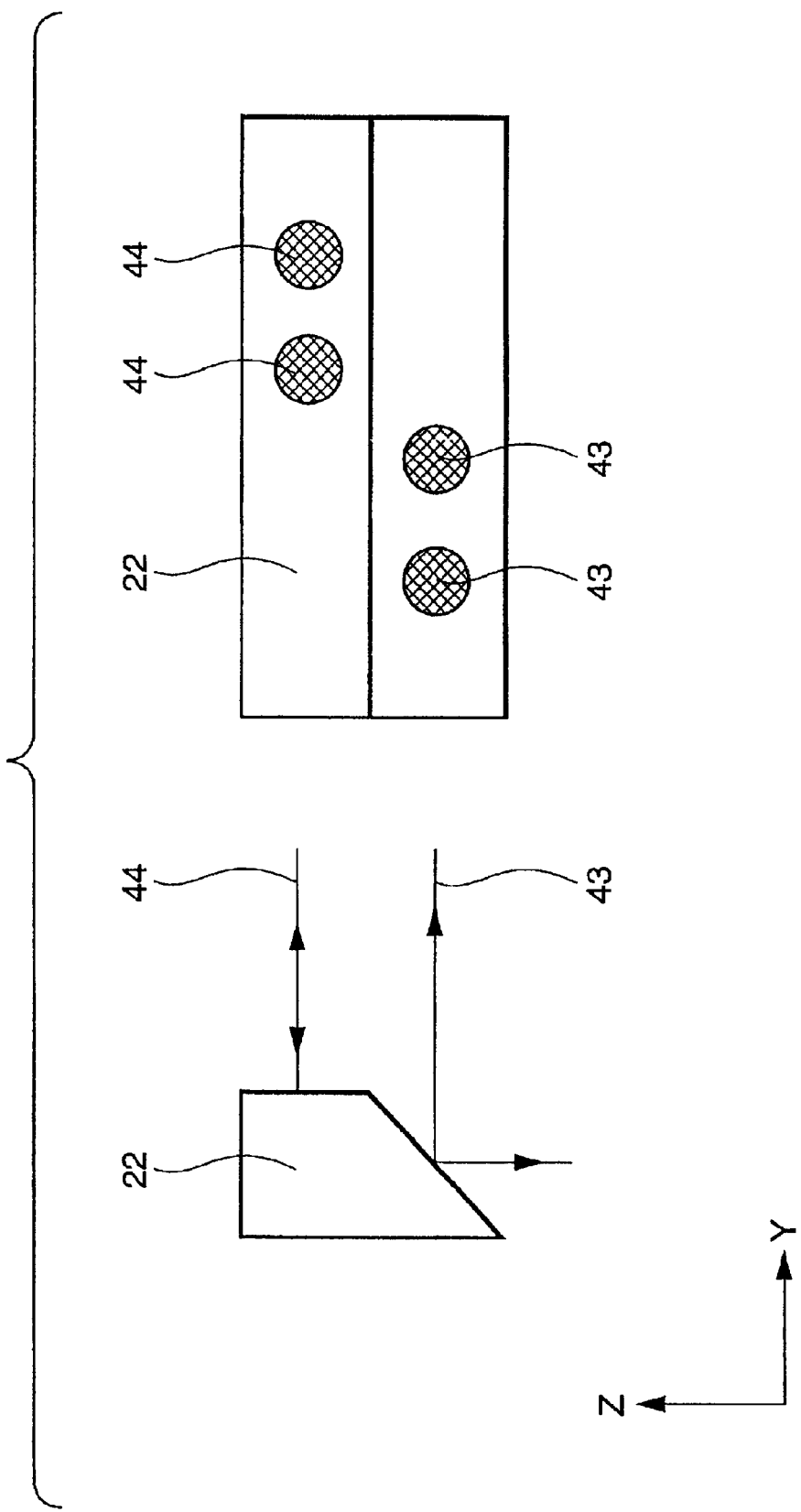
FIG. 5 is a view showing a Z measuring mirror according to the embodiment of the present invention.

The Z interferometer 25 is a plane mirror interferometer whose measurement light is reflected twice by the Z mirror 30 (double path). At this time, reference light is guided to the mirror 22 with a shape shown in FIG. 5 or a functionally similar beam layout shown in FIG. 5.

The first mirror 21 reflects to the second mirror 22 a beam emitted by the Z interferometer 25 perpendicularly to the XY plane. The second mirror 22 reflects reference light 44 back to the incident optical path, reflects measurement light 43 to the Z mirror 30, and reflects the measurement light reflected by the Z mirror 30 to the first mirror 21. The mirror 21 reflects the reflected reference light 44 and measurement light 43 toward the Z interferometer 25.

From the reflected light, the Z interferometer 25 detects position variation information along the beam incident direction (Z direction). That is, the Z interferometer 25 detects the optical path length change amount between the second mirror 22 and the Z mirror 30 on the basis of the reference light 44 and measurement light 43. Thus, the second mirror is desirably fixedly supported by a support (not shown) serving as a measurement reference for the interferometers 23 and 24. The first mirror may be fixed to the same support (not shown).

The Z mirror 30 reflects a beam from the Z interferometer 25 back to the incident optical path. The Z mirror 30 has a length corresponding to the moving amount of the top stage 27 in the X direction, and is fixedly supported on the top stage 27.

Each laser interferometer is a device for detecting position change information (displacement, speed, or the like) of the reflecting surface. Details of the structure are well known, and a description thereof will be omitted.

The positions of the mirrors 28 and 29, i.e., the initial position of the top stage 27 is stored in a control unit (not shown). The current position of the top stage 27 is obtained by adding the displacements of the mirrors 28 and 29 measured by the laser interferometers to the initial position. The X- and Y-positions of the top stage 27 are measured by the interferometers 23a and 24a. The rotational amount of the top stage 27 in the θ direction is measured by detecting the different between the detection values of the laser interferometers 23b and 23c and performing arithmetic processing by the control unit. The rotational amount of the top stage 27 in the ωX direction is measured by detecting the difference between the detection values of the laser interferometers 24a and 24b (or 25a and 25b) and performing arithmetic processing within the control box.

The Z position of the top stage 27 is obtained by adding the displacement of the mirror 30 measured by the laser interferometer 25 to the initial position of the top stage 27 stored in the control unit.

As the features of the first embodiment, the mirror mounted on the top stage 27 is simple, and (1) the Y mirror 29 and Z mirror 30 can be integrated. This can downsize the shape of the top stage 27, and (2) an uncertain alignment error factor such as thermal deformation of the top stage 27 can be reduced. The top stage 27 can be reduced in weight, and (3) the natural frequency of the top stage 27 can be increased to improve the alignment control performance.

The Z measurement interferometer is mounted on the Y stage in this embodiment, but can be mounted on the X stage with the same effects.

Referring back to FIG. 2, when the operation of the semiconductor exposure apparatus according to the first embodiment starts, the main body active mount 36 moves to a prescribed position to release the lens barrel support 35 from vibrations from the floor. Then, the stage active mount 37 moves to a prescribed position to release the stage surface plate 41 from vibrations from the floor. Each laser interferometer is initialized and performs return-to-origin operation. As a result, the value of the interferometer exhibits a position relative to the projection lens 34 or lens barrel support 35. The position measuring method for the X stage 40, Y stage 31, and top stage (θZ stage) 27 after return-to-origin operation has been described above.

The stage active mount 37 is controlled by calculating a reaction force on the stage surface plate 41 on the basis of the driving signals of the X stage 40, Y stage 31, and top stage (θZ stage) 27 when each stage is driven. The stage active mount 37 may be subjected to feed forward control so as not to cause the stage surface plate 41 to vibrate or be displaced by the reaction force.

The reticle 33 is set on a reticle stage (not shown). The reticle stage is supported on a reticle stage surface plate supported by the lens barrel support 35, and can move while holding the reticle bearing a circuit pattern. Exposure light which illuminates the pattern of the reticle 33 on the reticle stage and illuminates a wafer on the top stage 27 is generated by the illumination unit 32.

The wafer is scanned in synchronism with the reticle 33. While the reticle stage and the wafer stage which supports the wafer are scanned, their positions are continuously detected by corresponding interferometers, and fed back to the driving units of the reticle and wafer stages. This enables accurately synchronizing the scan start positions of the reticle and wafer stages and controlling the scan speed within a constant-speed scan region with high precision. While the reticle and wafer stages are scanned with respect to the projection lens 34, the wafer is exposed to the reticle pattern to transfer the circuit pattern.

According to the first embodiment, a beam emitted from a position on the movable portion perpendicularly to the XY plane passes through the mirrors 21 and 22 attached to the lens barrel support 35, and enters the reflecting surface of the Z mirror 30 attached onto the top stage 27 that is parallel to the XY plane, thereby measuring the Z position of the top stage 27. The Z position of the top stage 27 can be directly measured by using as a reference the lens barrel support 35 which supports the interferometer. Even if the stage guides deforms or the stage surface plate which supports the stage deforms along with movement of the stage, a position measurement error in the Z direction can be reduced.

Installation of an alignment apparatus having this measuring system in a semiconductor exposure apparatus allows measuring the position and posture of a wafer at high precision, and can realize high-precision exposure.

Second Embodiment

The second embodiment of the present invention will be described below with reference to the accompanying drawings.

Figure 3:
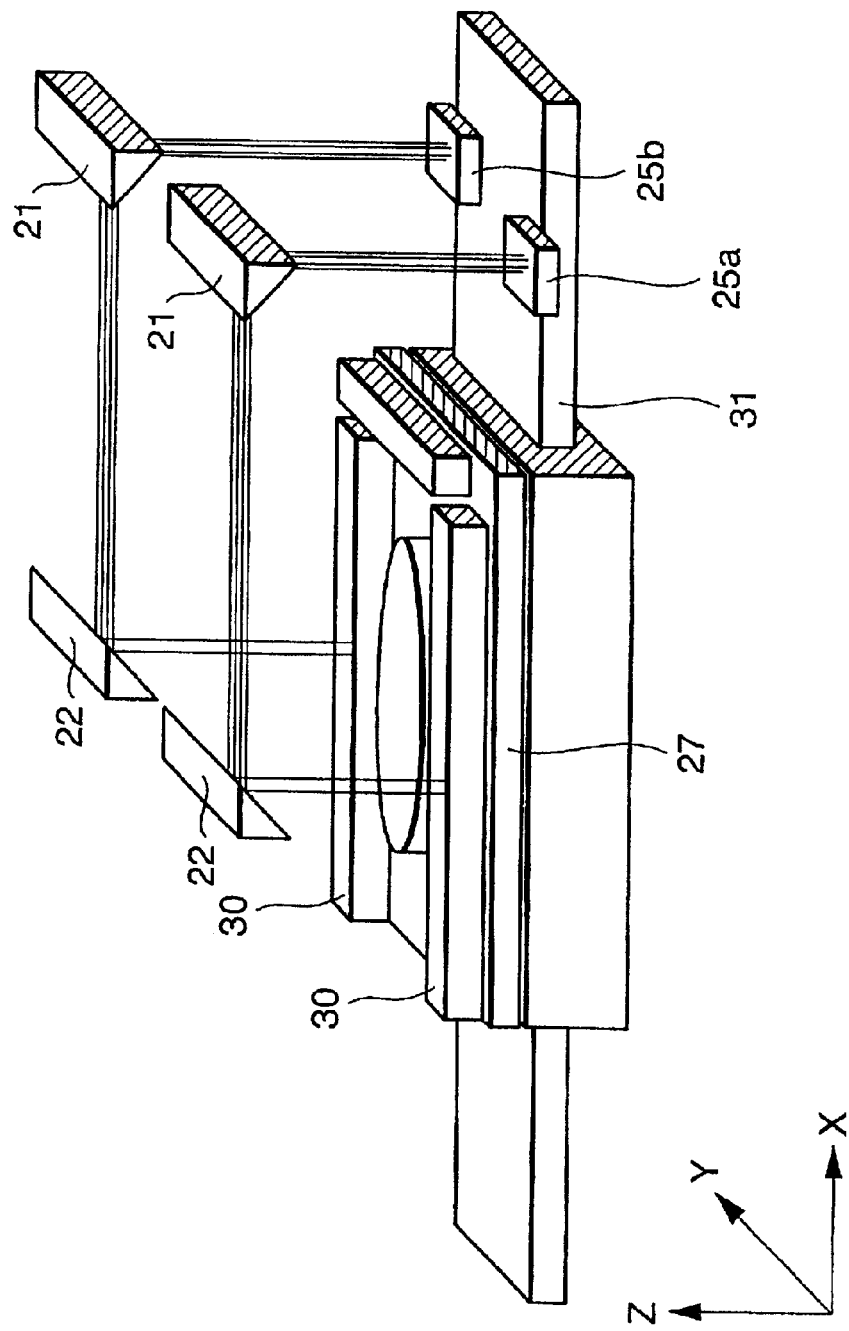
FIG. 3 is a perspective view schematically showing Z measurement according to the second embodiment of the present invention.

FIG. 3 shows an alignment apparatus constituted by mounting two interferometer systems for Z measurement shown in FIG. 1 in an exposure apparatus shown in FIG. 2.

In FIG. 3, a lens barrel which shields measurement light is positioned at the center of a lens barrel support 35 in the exposure apparatus as shown in FIG. 2. Thus, the Z interferometer system as described in the first embodiment cannot perform Z measurement in the entire stroke range when the movable range of the top stage 27 is a long stroke. To solve this problem, the second embodiment adopts two Z interferometer systems. Reference numerals 25a and 25b denote Z interferometers which measure a Z position and are mounted on a Y stage 31. Beams emitted by the Z interferometers 25a and 25b are arranged such that beams emitted by the Z interferometers 25a and 25b travel perpendicularly to the XY plane, or are so constituted as to vertically guide the beams by optical elements such as mirrors. Emerging beams pass through mirrors 21 and 22 attached to the lens barrel support 35, and strike the reflecting surfaces of Z mirrors 30 attached onto a top stage 27 that are parallel to the XY plane, thereby measuring the Z position of the top stage 27.

At this time, the reflecting surfaces of the two Z mirrors 30 are measured by switching the operation status (e.g., stage position) of the top stage 27. The top stage 27 can be measured while measurement light avoids not only the lens barrel but also an obstacle which shields it.

In switching, a control unit (not shown) hands over a measurement value from an interferometer which has performed measurement to an interferometer which can start measurement. In switching, the stage is positioned in a measurement region where two interferometer systems overlap each other. The overlapping measurement region is designed in consideration of the switching time so as to enable switching even while the stage moves.

Figure 4:
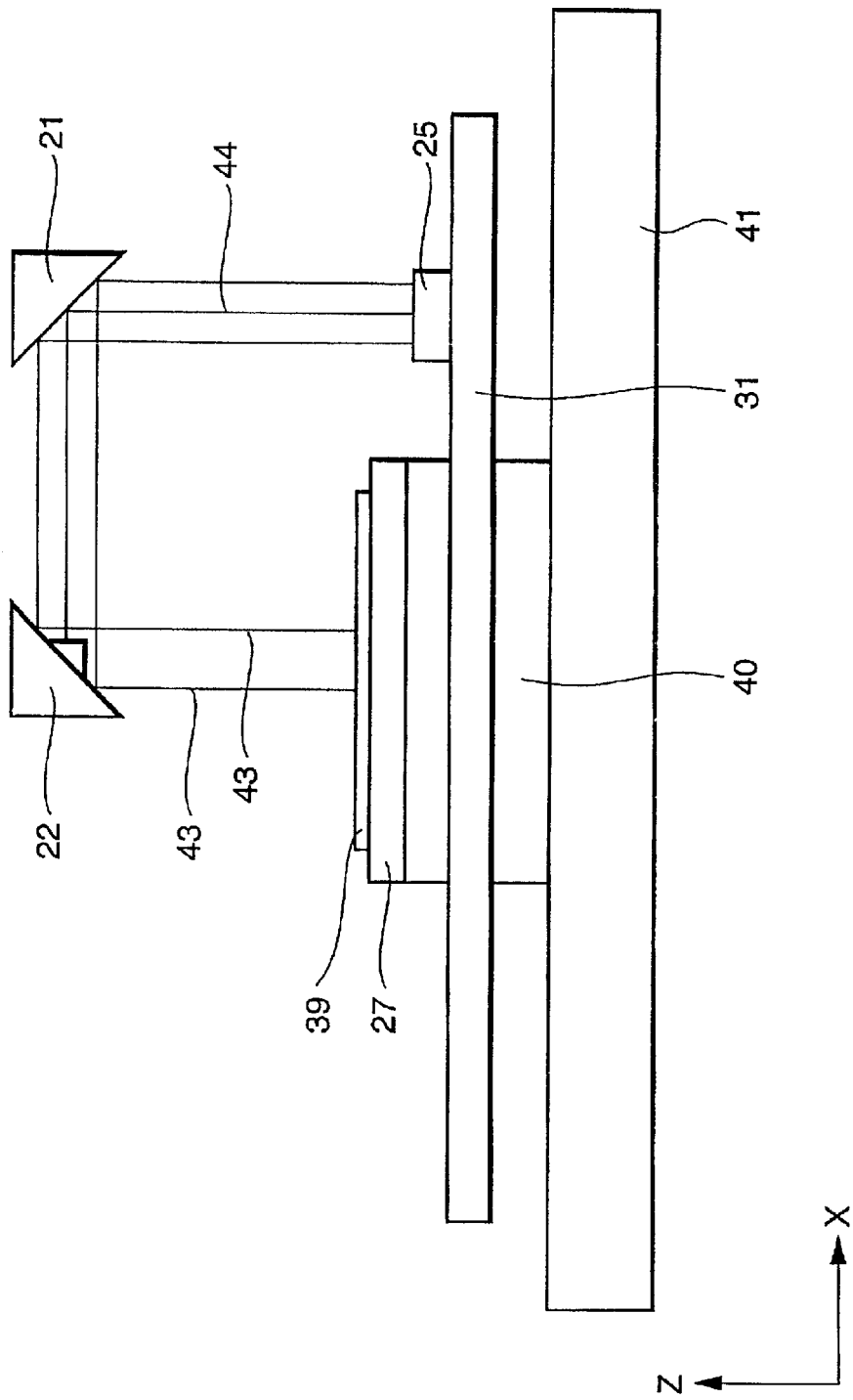
FIG. 4 is a front view showing the optical path of an interferometer according to the embodiment of the present invention.

Each of the Z interferometers 25a and 25b used for Z measurement emits two, measurement and reference beams. As for the emerging beams, measurement light 43 and reference light 44 which are emitted by the Z interferometer 25 perpendicularly to the XY plane are reflected by the first mirror 21 and guided to the second mirror 22, as shown in FIG. 4. The reference light 44 is reflected back to the incident optical path by the second mirror 22, whereas the measurement light 43 enters the reflecting surface of the Z mirror 30. Position variation information along the beam incident direction (Z direction) is detected from the reflected light.

Figure 6:
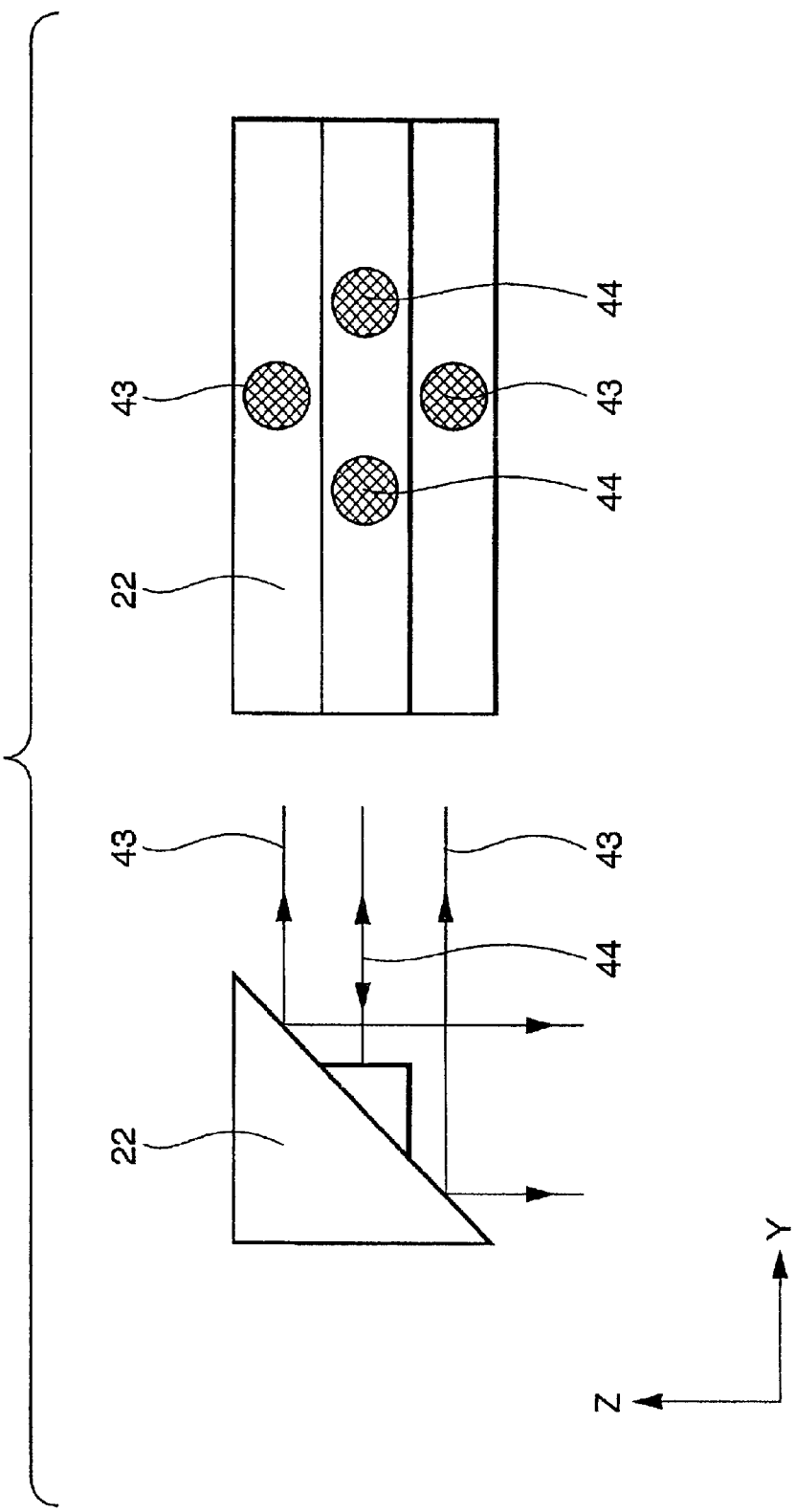
FIG. 6 is a view showing a Z measuring mirror according to the embodiment of the present invention.

The second mirror 22 has a shape shown in FIG. 6 or a functionally similar shape, and provides a cross-shaped positional relationship between the measurement light 43 and reference light 44 which enter the mirror 22, as shown in FIG. 6. If the beam interval from the intersection is equal between beams connected by lines, an optical path difference by a tilt of the mirror or the like does not occur and does not cause any measurement error. From this, the beam interval from the center is desirably equal.

In the use of the interferometer system as described in the second embodiment, the optical paths of reference light and measurement light are almost equal up to a position (second mirror 22) immediately above the top stage 27 to be measured even if the optical path (dead path) of measurement light is long, like the second embodiment. Measurement is hardly influenced by air turbulence or the like, and is higher in precision than a conventional measuring method.

In the embodiment, only one or two interferometer systems are arranged on the top stage 27. The present invention is not limited to this, and three or more interferometer systems may be arranged. Measurement at three portions can attain not only Z displacement of the top stage 27 using the lens barrel support 35 as a reference but also rotational information of the top stage 27 in the tilt direction ($\omega X$ and $\omega Y$).

Beams emitted by the Z interferometers 25a and 25b and a beam incident on the Z mirror 30 need not be perpendicular to the XY plane, and the incident beam may be tilted.

The measuring method, measuring apparatus, or interferometer system according to the embodiment can be applied not only to an exposure apparatus but also to an alignment apparatus for another precision processing machine. When the measuring method, measuring apparatus, or interferometer system is used in the exposure apparatus, it is not limited to the above-described wafer stage but can also be applied to a reticle stage. Further, the same effects can also be obtained by applying the measuring system of the embodiment to an alignment apparatus for accurately aligning a moving member.

Third Embodiment

The third embodiment of the present invention will be described below with reference to the accompanying drawings.

Figure 7:
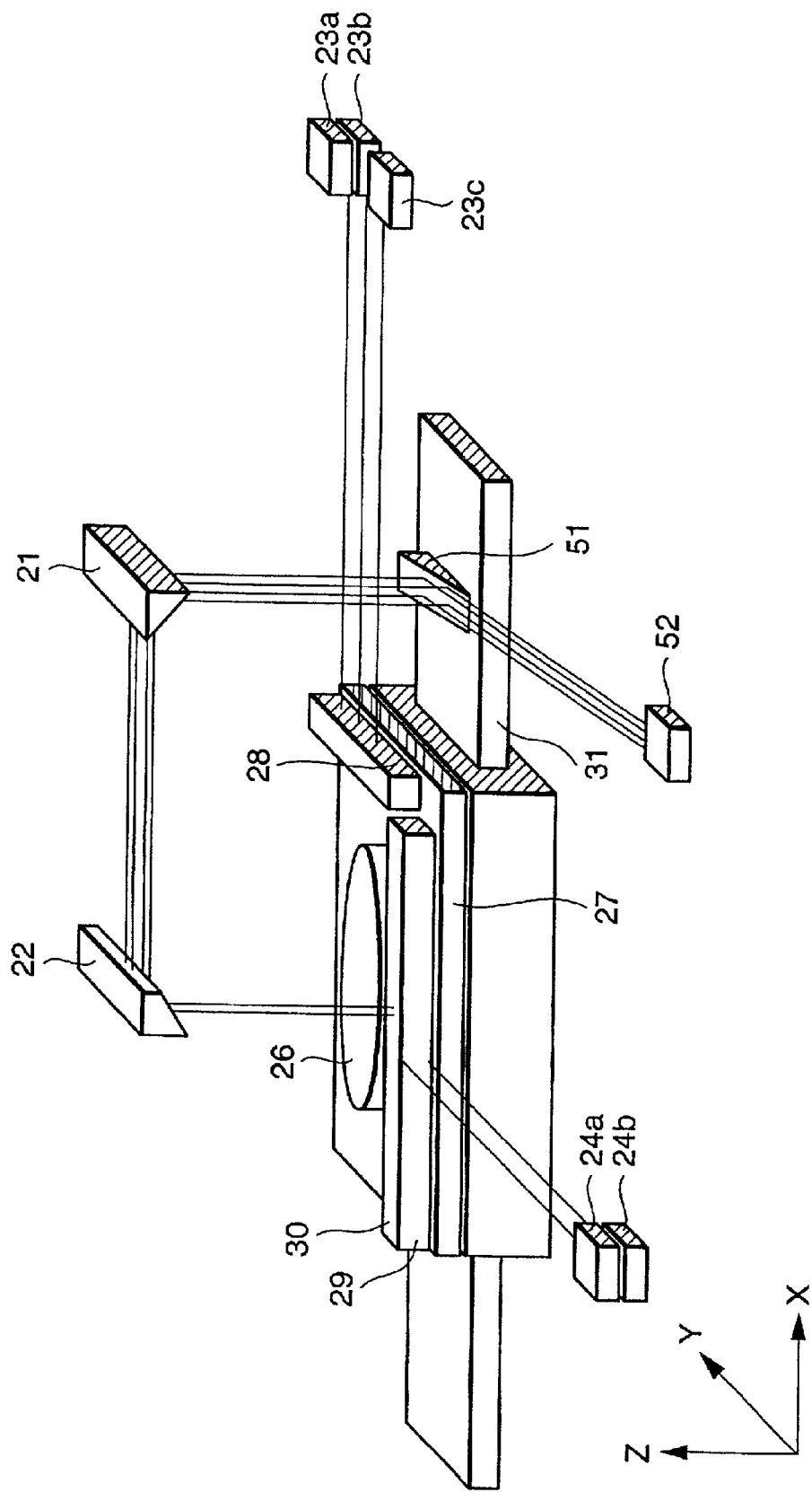
FIG. 7 is a perspective view schematically showing Z measurement according to the third embodiment of the present invention.

FIG. 7 shows an alignment apparatus having an optical element 51 for reflecting, to the Z direction, measurement light and reference light incoming from the Y direction, instead of the Z interferometer 25 mounted on the Y stage 31 in the above embodiment.

In FIG. 7, the same reference numerals as in the above embodiments denote the same parts, and a description thereof will be omitted.

The optical element 51 has a reflecting surface for reflecting, to the Z direction, measurement light and reference light incoming from the Y direction. Reference numeral 52 denotes a Z interferometer for measuring a Z position. The Z interferometer 52 emits measurement light and reference light parallel to the Y direction toward the optical element 51. The optical element 51 reflects the measurement light and reference light emitted by the Z interferometer 52 toward a first mirror 21 in the Z direction. The light reflected by the first mirror 21, a second mirror 22, and a Z mirror 30 is reflected by the optical element 51 toward the interferometer 52. The interferometer 52 detects position change information along the Z direction from the reflected light.

The third embodiment can eliminate the need for mounting an interferometer on a Y stage 31, and can implement a lightweight, high-rigidity Y stage. Since the Y stage 31, which supports the optical element 51 moves in the Y direction, the optical element 51 need not be an elongated mirror, unlike the mirrors 21, 22 and 28 to 30.

The third embodiment can attain the same effects as those of the above embodiments.

Embodiment of Semiconductor Production System

A production system for producing a semiconductor device (e.g., a semiconductor chip such as an IC or LSI, a liquid crystal panel, a CCD, a thin-film magnetic head, a micromachine, or the like) by the exposure apparatus according to the present invention will be exemplified, a trouble remedy or periodic maintenance of a manufacturing apparatus installed in a semiconductor manufacturing factory, or maintenance service such as software distribution is performed by using a computer network outside the manufacturing factory.

Figure 8:
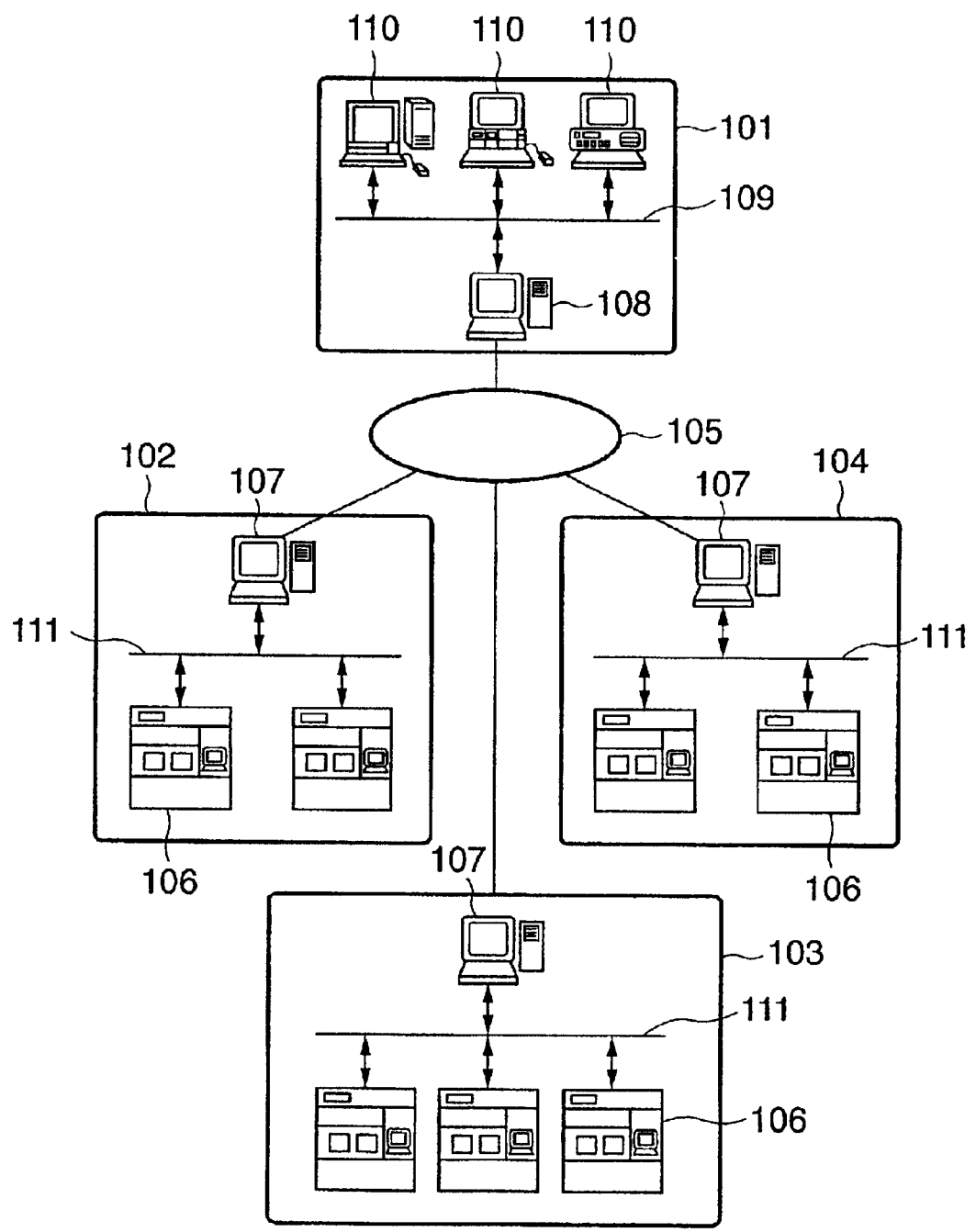
FIG. 8 is a view showing the concept of a semiconductor device production system using the exposure apparatus according to the present invention when viewed from a given angle.

FIG. 8 shows the overall system cut out at a given angle. In FIG. 8, reference numeral 101 denotes a business office of a vendor (e.g., an apparatus supply manufacturer), which provides a semiconductor device manufacturing apparatus. Examples of the manufacturing apparatus are semiconductor manufacturing apparatuses for performing various processes used in a semiconductor manufacturing factory, such as pre-process apparatuses, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 10, and a LAN (Local Area Network) 109, which connects the host management system 108 and computers 110 to build an intranet. The host management system 108 has a gateway for connecting the LAN 109 to Internet 105 as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers or the same manufacturer (e.g., a pre-process factory, a post-process factory, and the like). Each of the factories 102 to 104 is equipped with a plurality of manufacturing apparatuses 106, a LAN (Local Area Network) 111, which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user. More specifically, the factory notifies the vendor via the Internet 105 of status information (e.g., the symptom of a manufacturing apparatus in trouble) representing the operation status of each manufacturing apparatus 106, and receives response information (e.g., information designating a remedy against the trouble, or remedy software or data) corresponding to the notification, or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated network (e.g., an ISDN) having high security, which inhibits access of a third party, can be adopted. Also, the user may construct a database in addition to the one provided by the vendor and set the database on an external network, and the host management system may authorize access to the database from a plurality of user factories.

Figure 9:
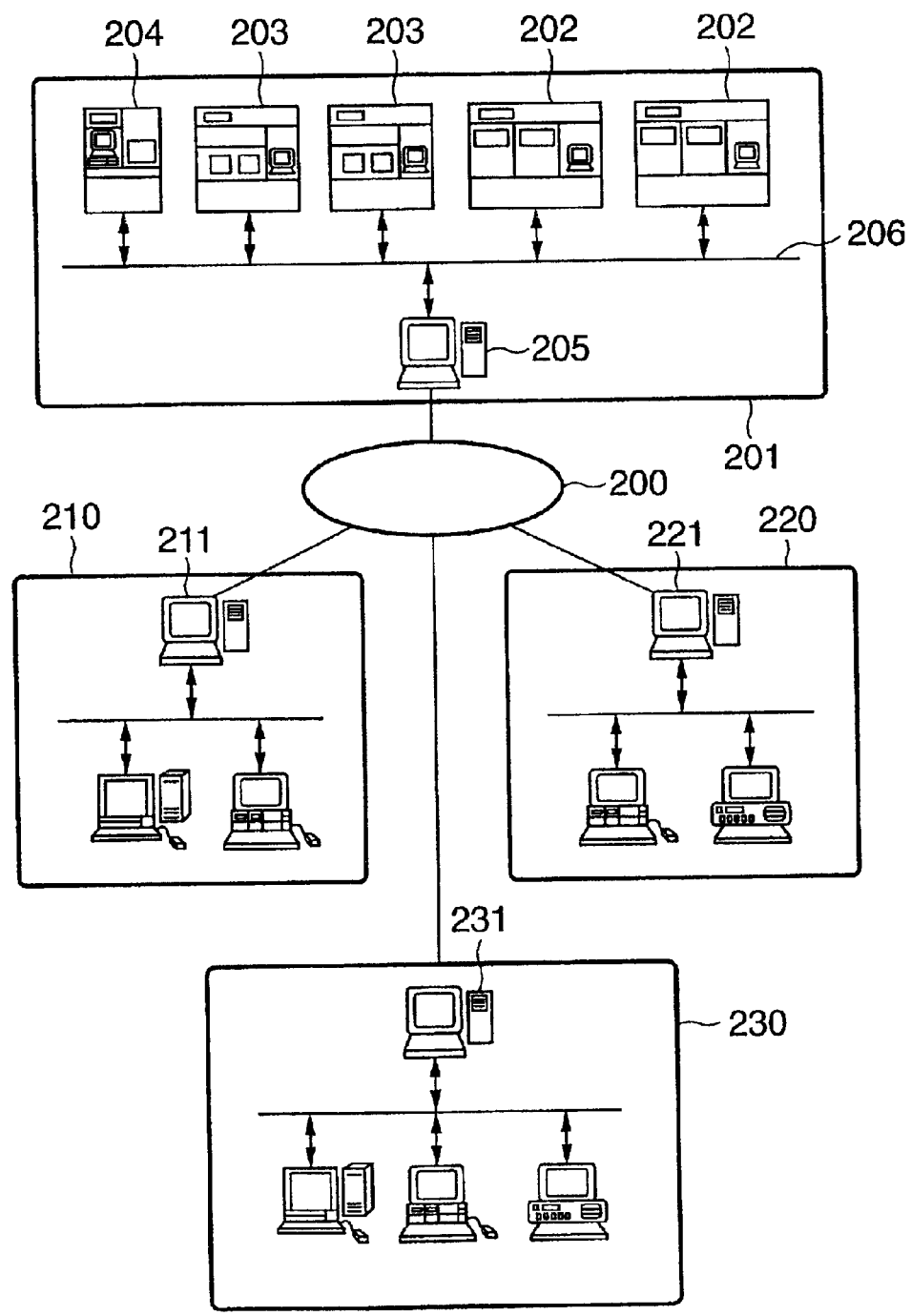
FIG. 9 is a view showing the concept of the semiconductor device production system using the exposure apparatus according to the present invention when viewed from another angle.

FIG. 9 is a view showing the concept of the overall system of this embodiment that is cut out at a different angle from FIG. 8. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 9, a factory having manufacturing apparatuses of a plurality of vendors and the management systems of the vendors for these manufacturing apparatuses are connected via the external network of the factory, and maintenance information of each manufacturing apparatus is communicated. In FIG. 9, reference numeral 201 denotes a manufacturing factory of a manufacturing apparatus user (semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 9 shows only one manufacturing factory 201, but a plurality of factories are networked in practice. The respective apparatuses in the factory are connected to a LAN 206 to build an intranet, and a host management system 205 manages the operation of the manufacturing line. The business offices of vendors (e.g., apparatus supply manufacturers), such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Each manufacturing apparatus in the semiconductor manufacturing factory comprises a display, a network interface, and a computer for executing network access software and apparatus operating software, which are stored in a storage device. The storage device is a built-in memory, hard disk, or network file server. The network access software includes a dedicated or general-purpose web browser, and provides a user interface having a window as shown in FIG. 10 on the display. While referring to this window, the operator who manages manufacturing apparatuses in each factory inputs, in input items on the windows, pieces of information such as the type of manufacturing apparatus (401), serial number (402), subject of trouble (403), occurrence date (404), degree of urgency (405), symptom (406), remedy (407), and progress (408). The pieces of input information are transmitted to the maintenance database via the Internet, and appropriate maintenance information is sent back from the maintenance database and displayed on the display. The user interface provided by the web browser realizes hyperlink functions (410 to 412), as shown in FIG. 10. This allows the operator to access detailed information of each item, to receive the latest-version software to be used for a manufacturing apparatus from a software library provided by a vendor, and to receive an operation guide (help information) as a reference for the operator in the factory. Maintenance information provided by the maintenance database also includes information concerning the features of the above-described embodiments. The software library also provides the latest software for implementing the features of the above-described embodiments.

Figure 11:
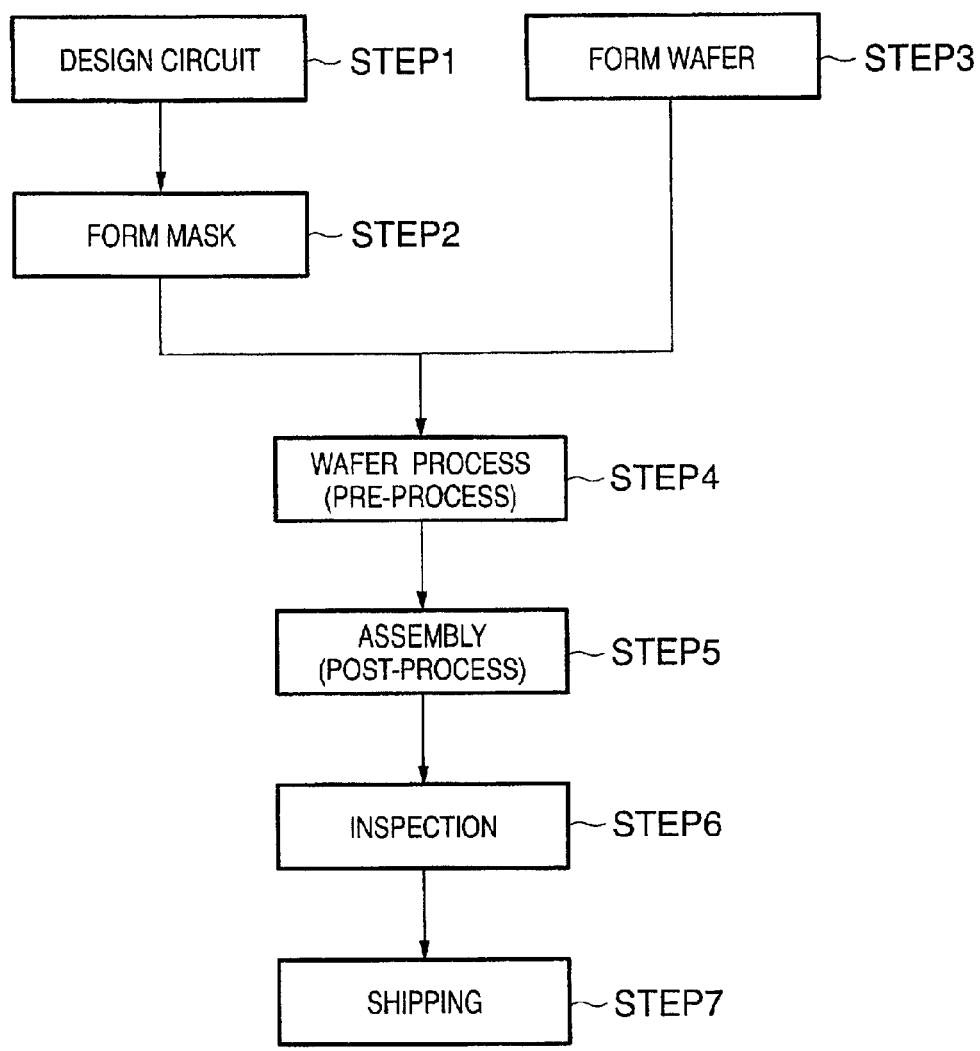
FIG. 11 is a flow chart for explaining the flow of a device manufacturing process.

A semiconductor device manufacturing process using the above-described production system will be explained. FIG. 11 shows the flow of the whole manufacturing process of the semiconductor device. In step 1 (circuit design), a semiconductor device circuit is designed. In step 2 (mask formation), a mask having the designed circuit pattern is formed. In step 3 (wafer formation), a wafer is formed by using a material such as silicon. In step 4 (wafer process), called a pre-process, an actual circuit is formed on the wafer by lithography using the prepared mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7). For example, the pre-process and post-process are performed in separate dedicated factories, and each of the factories receives maintenance by the above-described remote maintenance system. Information for production management and apparatus maintenance is communicated between the pre-process factory and the post-process factory via the Internet or dedicated network.

Figure 12:
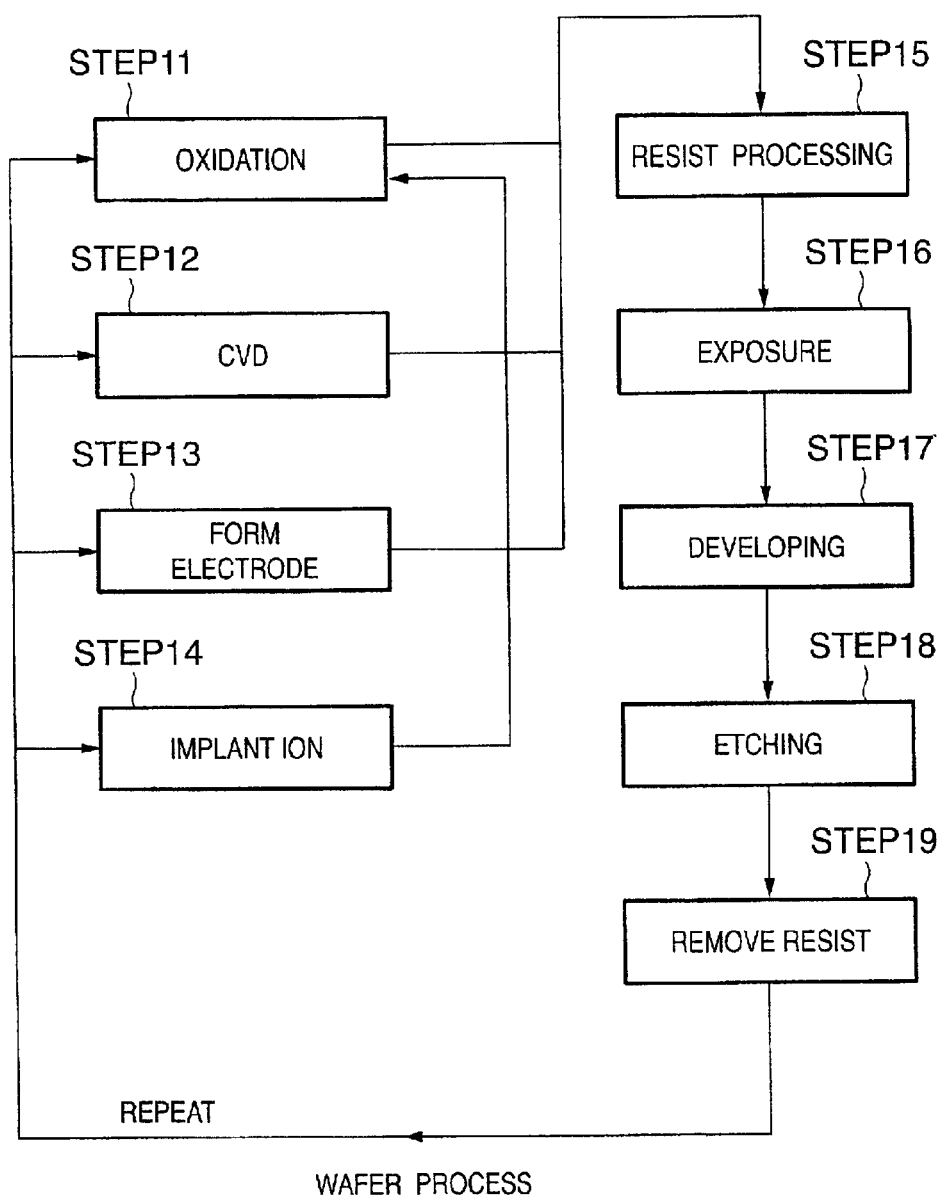
FIG. 12 is a flow chart for explaining a wafer process.
Figure 13:
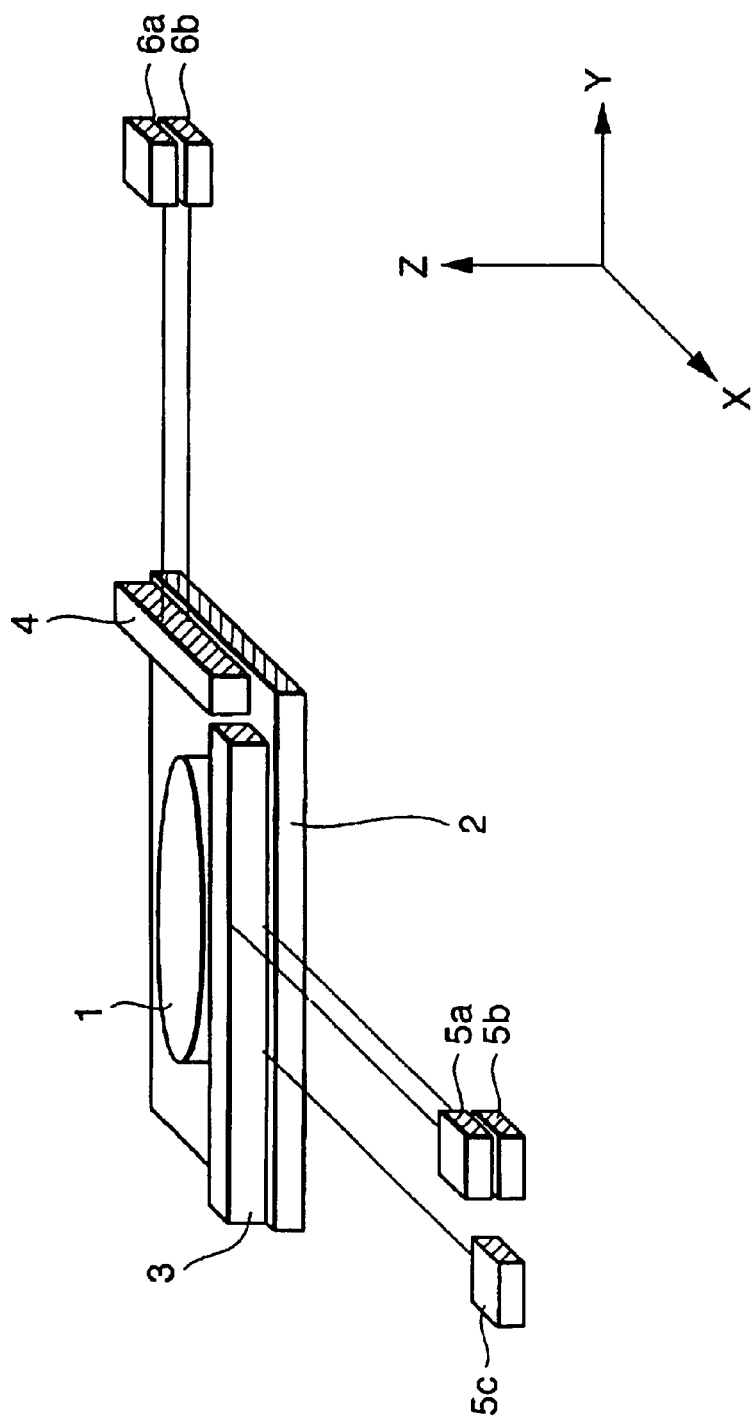
FIG. 13 is a perspective view schematically showing a conventional measuring system.
Figure 14:
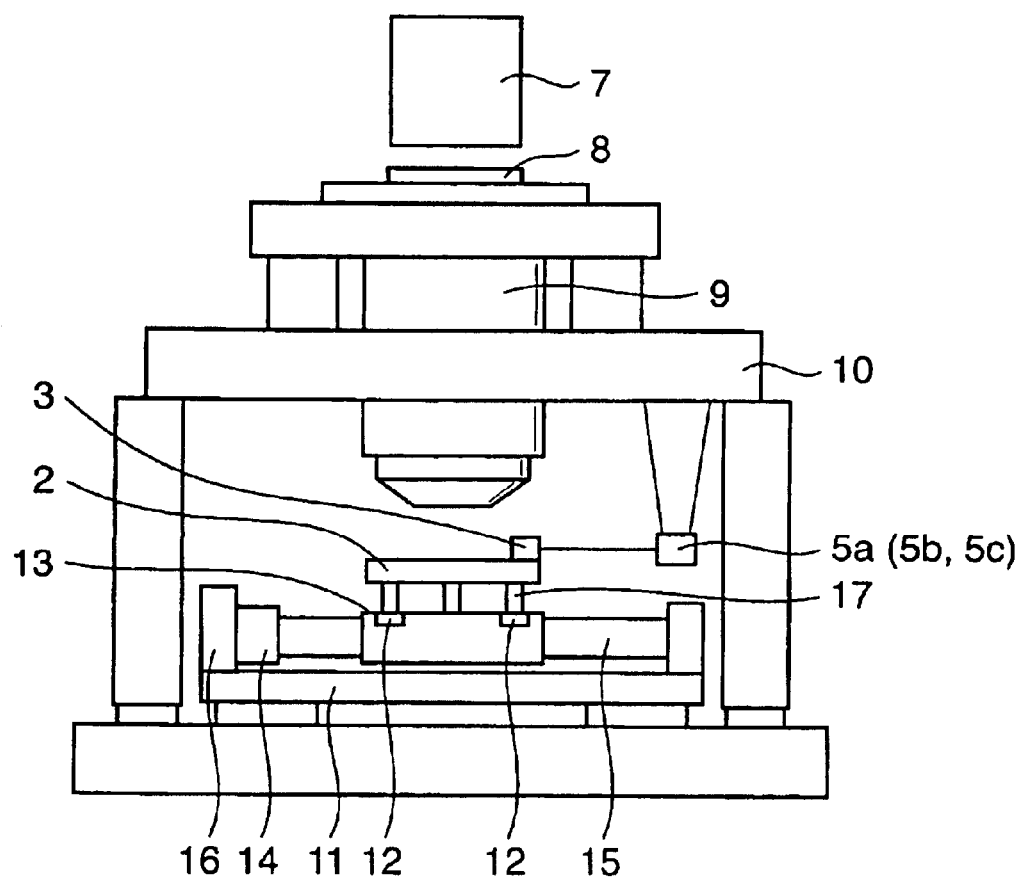
FIG. 14 is a front view showing a conventional exposure apparatus.
Figure 15:
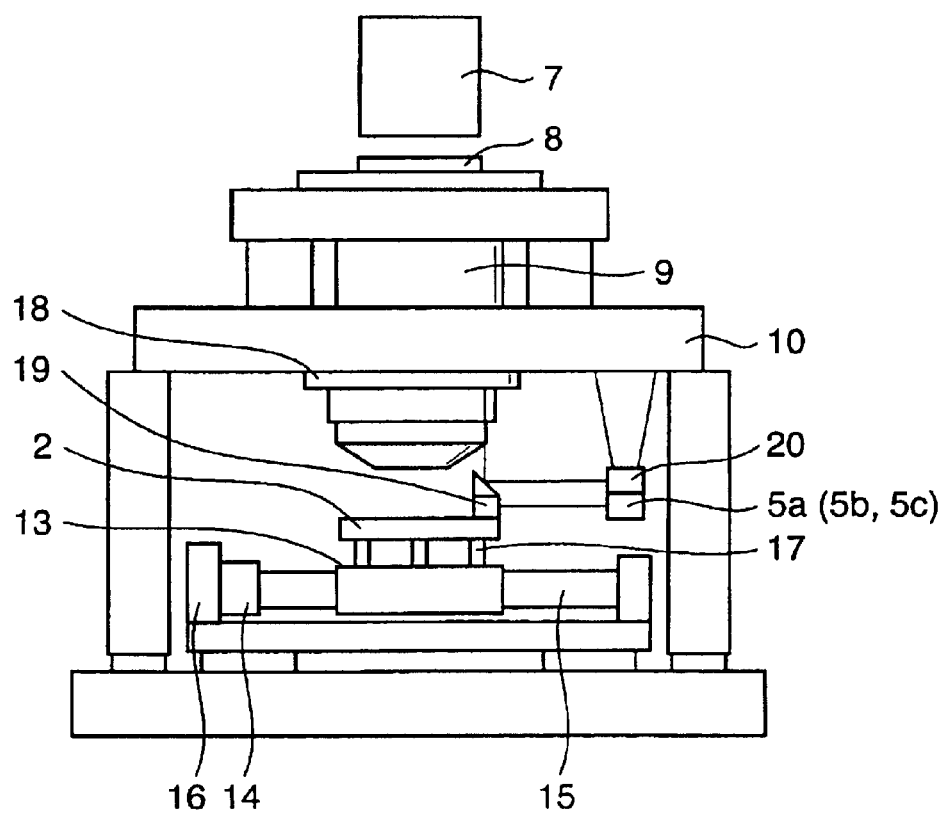
FIG. 15 is a front view showing another conventional exposure apparatus.

FIG. 12 shows the detailed flow of the wafer process. In step 11 (oxidation), the wafer surface is oxidized. Instep 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

The present invention can more accurately measure the position of a stage apparatus used in a semiconductor exposure apparatus or the like, and can achieve higher-precision alignment control.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus comprising:
    a projection optical system which projects a pattern formed on a master onto a substrate;
    a lens barrel support which supports the projection optical system;
    a stage capable of moving with respect to the projection optical system while holding at least one of the substrate and master;
    a Z measuring mirror which is arranged on the stage and has a reflecting surface substantially parallel to an XY plane; and
    an interferometer system having an interferometer for measuring a Z position and displacement of the stage with respect to the lens barrel support by using the reflecting surface of said Z measuring mirror.

2. The apparatus according to claim 1, wherein said interferometer system includes a plurality of interferometer systems arranged on the apparatus.

3. The apparatus according to claim 2, wherein a tilt amount of the stage is measured using measurement results of said plurality of interferometer systems.

4. The apparatus according to claim 2, wherein said interferometers in said interferometer systems have overlapping measurable regions, and when the stage is positioned in a region where the measurable regions overlap each other, measurement by said interferometer is switched.

5. The apparatus according to claim 2, wherein the apparatus further comprises control means for correcting a position and displacement on the basis of measurement results of the position and displacement by said interferometer systems, and measurement values of said plurality of interferometers are synchronously received and sent to said control means.

6. The apparatus according to claim 1, wherein said interferometer system includes a plurality of interferometer systems arranged on the apparatus over the projection optical system.

7. The apparatus according to claim 1, wherein the interferometer is mounted on at least either of the stage and a movable portion which follows the stage, the stage has an elongated mirror for Z measurement which is longer in a stroke direction of the movable portion which supports the interferometer, and the elongated mirror for Z measurement uses an upper surface of either of X and Y measuring mirrors.

8. The apparatus according to claim 1, wherein said interferometer system causes measurement light emitted by the interferometer to strike the Z measuring mirror via a plurality of mirrors or prisms attached to the lens barrel support serving as a measurement reference.

9. The apparatus according to claim 1, wherein measurement light from said interferometer system is substantially perpendicularly incident on the reflecting surface of the Z measuring mirror.

10. The apparatus according to claim 1, wherein the interferometer emits a total of four beams including two measurement beams and two reference beams, and the four beams are formed with a cross-shaped positional relationship at a substantially equal interval.

11. The apparatus according to claim 1, wherein a mirror or prism arranged immediately in front of the Z measuring mirror has at least two reflecting surfaces for reflecting measurement light to the Z measuring mirror and reference light back to an incident optical path.

12. The apparatus according to claim 1, wherein a plurality of interferometers in said interferometer system have overlapping measurable regions when a central position of the stage is controlled to be near an exposure center.

13. The apparatus according to claim 1, further comprising:
an interface for connecting a network;
a computer for executing network software for communicating maintenance information of the exposure apparatus via the network; and
a display for displaying the maintenance information of the exposure apparatus that is communicated by the network software executed by said computer.

14. The apparatus according to claim 13, wherein the network software provides on said display a user interface for accessing a maintenance database which is provided by a vendor or user of the exposure apparatus and connected to the external network outside a factory where the exposure apparatus is installed, and enables obtaining information from the database via the external network.

15. An exposure apparatus comprising:
a Y stage movable in a Y direction;
an X stage movable in an X direction with respect to said Y stage;
a Z mirror which is mounted on said X stage or Y stage and has a reflecting surface parallel to an XY plane;
a mirror or prism for guiding to said Z mirror a beam emitted to a Z direction by said Y stage; and
an interferometer for detecting a Z position of said X stage or Y stage by using the beam reflected by the reflecting surface of said Z mirror.

16. The apparatus according to claim 15, wherein said interferometer is mounted on said Y stage or said X stage.

17. The apparatus according to claim 15, wherein said interferometer is mounted in the X or Y direction, the apparatus further comprises an optical element having a reflecting surface for reflecting a beam from the X or Y direction to the Z direction, and said interferometer emits a beam parallel to the X or Y direction toward said optical element.

18. The apparatus according to claim 15, wherein said mirror or prism for guiding the beam to said Z mirror has a first mirror or prism for reflecting to the X or Y direction a beam emitted to the Z direction by said Y stage or X stage, and a second mirror or prism for reflecting to the Z direction the beam reflected by the first mirror or prism and irradiating said Z mirror with the beam.

19. The apparatus according to claim 18, wherein the first mirror or prism and the second mirror or prism are elongated in the X or Y direction.

20. The apparatus according to claim 18, wherein the second mirror or prism has a reflecting surface for reflecting to the first mirror or prism a reference light component of the beam reflected by the first mirror or prism.

21. A semiconductor device manufacturing method comprising the steps of:
installing a plurality of semiconductor manufacturing apparatuses including an exposure apparatus in a factory; and
manufacturing a semiconductor device by using the plurality of semiconductor manufacturing apparatuses,
wherein the exposure apparatus comprises:
a projection optical system which projects a pattern formed on a master onto a substrate;
a lens barrel support which supports the projection optical system;
a stage capable of moving with respect to the projection optical system while holding at least one of the substrate and master;
a Z measuring mirror which is arranged on the stage and has a reflecting surface substantially parallel to an XY plane; and
an interferometer for measuring a Z position and displacement of the stage with respect to the lens barrel support by using the reflecting surface of Z measuring mirror.

22. The method according to claim 21, further comprising the steps of:
connecting the plurality of semiconductor manufacturing apparatuses to a local area network;
connecting the local area network to an external network outside the semiconductor manufacturing factory;
acquiring information about the exposure apparatus from a database on the external network by using the local area network and the external network; and
controlling the exposure apparatus on the basis of the acquired information.

23. The method according to claim 22, wherein a database provided by a vendor or user of the exposure apparatus is accessed via the external network, thereby obtaining maintenance information of the manufacturing apparatus by data communication, or data communication is performed between the semiconductor manufacturing factory and another semiconductor manufacturing factory via the external network, thereby performing production management.

24. A semiconductor manufacturing factory comprising:
a plurality of semiconductor manufacturing apparatuses including an exposure apparatus;
a local area network for connecting said plurality of semiconductor manufacturing apparatuses; and
a gateway for connecting said local area network to an external network outside the semiconductor manufacturing factory,
wherein information about at least one of said plurality of semiconductor manufacturing apparatuses can be communicated,
said exposure apparatus comprising:
a projection optical system which projects a pattern formed on a master onto a substrate;
a lens barrel support which supports the projection optical system;
a stage capable of moving with respect to the projection optical system while holding at least one of the substrate and master;
a Z measuring mirror which is arranged on the stage and has a reflecting surface substantially parallel to an XY plane; and
an interferometer for measuring a Z position and displacement of the stage with respect to the lens barrel support by using the reflecting surface of said Z measuring mirror.

25. A maintenance method for an exposure apparatus installed in a semiconductor manufacturing factory, comprising the steps of:
preparing a database for accumulating information about maintenance of the exposure apparatus on an external network outside a factory where the exposure apparatus is installed;
connecting the exposure apparatus to a local area network in the factory; and maintaining the exposure apparatus on the basis of information accumulated in the database by using the external network and the local area network, wherein the exposure apparatus comprises:
- a projection optical system which projects a pattern formed on a master onto a substrate;
- a lens barrel support which supports the projection optical system;
- a stage capable of moving with respect to the projection optical system while holding at least one of the substrate and master;
- a Z measuring mirror which is arranged on the stage and has a reflecting surface substantially parallel to an XY plane; and
- an interferometer for measuring a Z position and displacement of the stage with respect to the lens barrel support by using the reflecting surface of said Z measuring mirror.

26. An exposure apparatus comprising:
a projection lens;
a barrel support which supports the said projection lens;
a stage capable of moving along an XY plane with a reflecting surface substantially parallel to the XY plane; and
an interferometer used to search for information which indicates a position of a Z direction of said stage to said barrel support using light reflected in said reflecting surface.

27. The apparatus according to claim 26, wherein the stage has a mirror that makes the reflecting surface substantially parallel to the XY plane.

28. The apparatus according to claim 27, wherein a different surface from the reflecting surface of the mirror is used in order to search for information which indicates a position of a direction along the XY plane of the stage.

29. The apparatus according to claim 26, wherein the stage has a Y stage capable of moving in a Y direction, and an X stage capable moving in an X direction to said Y stage while supporting a substrate on which a pattern is projected through the projection lens, wherein the X stage has the reflecting surface.

30. The apparatus according to claim 29,
wherein the barrel support has a first optical element, and
wherein a light reflected in the reflecting surface reaches a second optical element which moves with the Y stage, after being reflected with said first optical element.

31. The apparatus according to claim 30, wherein the second optical element has a guide element to guide light reached to said second optical element into the interferometer.

32. An exposure apparatus includes:
a projection lens;
a barrel support which supports said projection lens;
a Y stage capable of moving in a Y direction;
an X stage capable of moving in an X direction to said Y stage while supporting a substrate on which a pattern is projected through said projection lens;
a Z mirror which has a substantially parallel reflecting surface in an XY plane, wherein said Z mirror moves with said X stage; and
a Z interferometer used to search for information which indicates a position of a Z direction of said X stage to said barrel support using light reflected in the reflecting surface of said Z mirror.

33. The apparatus according to claim 32,
wherein the stage has a Y mirror and an X mirror,
wherein said apparatus further includes a Y interferometer used to search for information which indicates a position of the Y direction of the X stage using light reflected in a reflecting surface of said Y mirror, and an X interferometer used to search for information which indicates a position of the X direction of the X stage using light reflected from a reflecting surface of said X mirror.

34. The apparatus according to claim 33, wherein the Z mirror is disposed as one body in an upper surface of an element in which the Y mirror is disposed.

35. The apparatus according to claim 34,
wherein the barrel support has a first optical element,
wherein a light reflected in the reflecting surface reaches a second optical element which moves with the Y stage, after being reflected with said first optical element.

36. The apparatus according to claim 35, wherein the second optical element has a guide element to guide light reached to said second optical element into the Z interferometer.

37. The apparatus according to claim 36,
wherein the first optical element has a plurality of reflective elements extending in the Y direction,
wherein a light reflected by the Z mirror reaches to the second optical element after passing through said plurality of reflective elements.

* * * * *